(12) United States Patent
Peng

(10) Patent No.: US 6,569,581 B2
(45) Date of Patent: May 27, 2003

(54) ALTERNATING PHASE SHIFTING MASKS

(75) Inventor: Song Peng, Fremont, CA (US)

(73) Assignee: International Business Machines Corporation, Armonk, NY (US)

( * ) Notice: Subject to any disclaimer, the term of this patent is extended or adjusted under 35 U.S.C. 154(b) by 8 days.

(21) Appl. No.: 09/813,493

(22) Filed: Mar. 21, 2001

(65) Prior Publication Data
US 2002/0136963 A1 Sep. 26, 2002

(51) Int. Cl.[7] .................................................. G03F 9/00
(52) U.S. Cl. ............................................................. 430/5
(58) Field of Search ........................... 430/5, 311, 322, 430/323, 324; 438/638; 428/428; 216/58, 66

(56) References Cited

U.S. PATENT DOCUMENTS

| 5,700,605 | A |   | 12/1997 | Ito et al. ........................ 430/5 |
| 5,728,494 | A |   | 3/1998 | Kawano et al. ................. 430/5 |
| 5,741,613 | A |   | 4/1998 | Moon et al. .................... 430/5 |
| 5,907,393 | A |   | 5/1999 | Kawano et al. ............... 356/73 |
| 6,051,345 | A | * | 4/2000 | Huang ............................ 430/5 |
| 6,162,567 | A | * | 12/2000 | Watanabe ...................... 430/5 |
| 6,309,962 | B1 | * | 10/2001 | Chen et al. ................. 438/638 |
| 6,423,455 | B1 | * | 7/2002 | Tzu ................................ 430/5 |

FOREIGN PATENT DOCUMENTS

| JP | 8062822 A | 3/1996 |
| JP | 10282636 A | 10/1998 |

\* cited by examiner

Primary Examiner—S. Rosasco
(74) Attorney, Agent, or Firm—DeLio & Peterson LLC; Peter W. Peterson; Richard M. Kotulak

(57) ABSTRACT

A phase shifting mask for use in lithographic processing of semiconductor substrates comprises a mask substrate substantially transparent to the energy beam used and a patterned phase shifting layer disposed on the mask substrate and having openings therein exposing the mask substrate. The patterned phase shifting layer is comprised of a material of differing composition than the mask substrate and is of thickness sufficient to shift the phase of an energy beam passing through the thickness of the patterned layer and the mask substrate by 180 degrees, compared to the phase of the energy beam passing through the phase shifting layer openings and the mask substrate. Preferably the phase shifting material is a siliconoxynitride and the substrate is quartz. The mask also includes a patterned layer of a material substantially opaque to the energy beam disposed on the mask substrate or the patterned phase shifting mask layer.

20 Claims, 3 Drawing Sheets

ALTERNATING PHASE SHIFTING MASKS

BACKGROUND OF THE INVENTION

1. Field of the Invention

The present invention relates to masks used in lithographic processing of semiconductor devices and, in particular, to a phase shifting mask which may be used to shift the phase of the energy beam employed in the lithographic process.

2. Description of Related Art

Photolithographic process used for producing semiconductor devices and the like utilize masks which are formed by depositing materials opaque to the energy beam to be utilized in a desired pattern on a substrate which is generally transparent to such energy beam. The mask pattern is transferred via a spatially modulated energy beam, e.g. light, to create an aerial image which is transferred to a resist film on a substrate. After being exposed to the pattern, the resist film is contacted with the developer and subsequently an etchant to create a pattern for the desired structure to be created on the substrate.

Such lithographic techniques are used to form fine (i.e. narrow) lines and features on the semiconductor wafer. In order to produce narrower lines, higher resolution methods must be utilized. One such method is to employ phase shifting masks to apply alternating 180° phase differences to the energy being transmitted. When used on alternate transparent areas of the mask, such phase shifting masks reduce the minimum pattern resolution substantially, as compared to conventional photomask methods.

Alternating phase shifting masks are typically made by creating an alternating thickness of the transparent quartz substrate, normally by etching. Etching of the transparent quartz substrate provides difficulties in processing, particularly in controlling the depth of the etch and in repairing the quartz substrate. These difficulties are due in part to the fact that the quartz material of the substrate is only partially etched.

Some prior art phase shifting masks have employed spin-on-glass material added on to a patterned substrate. Such spin-on-glass material has not been particularly advantageous because it is difficult to maintain a uniform thickness when spin-coating a patterned substrate.

Bearing in mind the problems and deficiencies of the prior art, it is therefore an object of the present invention to provide an improved alternating phase shifting mask for use in lithographic processing of semiconductor substrates.

It is another object of the present invention to provide a phase shifting mask in which there is improved control in manufacturing the alternating phase shifting regions.

It is a further object of the present invention to provide an improved method for making an alternating phase shifting mask.

SUMMARY OF THE INVENTION

The above and other objects and advantages, which will be apparent to one of skill in the art, are achieved in the present invention which is directed to, in a first aspect, a phase shifting mask for use in lithographic processing of semiconductor substrates comprising a mask substrate substantially transparent to the energy beam used in the lithographic processing and a patterned phase shifting layer disposed on the mask substrate and having openings therein exposing the mask substrate. The patterned phase shifting layer is comprised of a material of differing composition than the mask substrate and of thickness sufficient to shift the phase of an energy beam passing through the thickness of the patterned layer and the mask substrate by 180 degrees, compared to the phase of the energy beam passing through the phase shifting layer openings and the mask substrate. The mask also includes a patterned layer of a material substantially opaque to the energy beam disposed on the mask substrate or the patterned phase shifting mask layer.

The patterned phase shifting layer material is substantially transparent to the energy beam, and preferably has a transmissivity of at least about 98%, more preferably about 98% to about 99.5%, of the energy beam passing therethrough.

In its preferred embodiment, the mask substrate comprises quartz and the patterned phase shifting layer material comprises a silicon oxy nitride. In such case the patterned phase shifting layer thickness is about 100–200 nm.

In another aspect, the present invention relates to a phase shifting mask for use in lithographic processing of semiconductor substrates comprising a quartz mask substrate and a patterned phase shifting layer disposed on the quartz mask substrate and having openings therein exposing the quartz mask substrate. The patterned phase shifting layer is comprised of a silicon oxy nitride of thickness sufficient to shift the phase of an energy beam passing through the thickness of the patterned layer and the quartz mask substrate by 180 degrees, compared to the phase of the energy beam passing through the phase shifting layer openings and the quartz mask substrate, the silicon oxy nitride having a transmissivity of at least about 98% of the energy beam passing therethrough. The mask also includes a patterned layer of a material substantially opaque to the energy beam disposed on the quartz mask substrate or the patterned phase shifting mask layer. Preferably, the patterned phase shifting layer thickness is about 100–200 nm.

A related aspect of the present invention provides a method of making a phase shifting mask for use in lithographic processing of semiconductor substrates comprising providing a mask substrate and depositing on the mask substrate a patterned phase shifting layer. The patterned phase shifting layer has openings therein exposing the mask substrate. The patterned phase shifting layer is comprised of a material of differing composition than the mask substrate and of thickness sufficient to shift the phase of an energy beam passing through the thickness of the patterned layer and the mask substrate by 180 degrees, compared to the phase of the energy beam passing through the phase shifting layer openings and the mask substrate. The method also includes depositing on the mask substrate a patterned layer of a material substantially opaque to the energy beam disposed on the mask substrate or the patterned phase shifting mask layer.

The patterned phase shifting layer material is substantially transparent to the energy beam, and preferably has a transmissivity of at least about 98% of the energy beam passing therethrough. More preferably, the mask substrate comprises quartz and the patterned phase shifting layer material comprises a silicon oxy nitride, wherein the patterned phase shifting layer is deposited on the quartz mask substrate at a thickness of about 100–200 nm.

In one method of the present invention, the patterned phase shifting layer is deposited on the quartz mask substrate by depositing a uniform layer of the phase shifting material and etching selected areas of the uniform layer to form the patterned phase shifting layer, and during the etching the quartz mask substrate acts as an etch stop.

Preferably, the etching of the phase shifting material is performed with a $CF_4+O_2$ or $CH_3F+O_2$ reactive ion etch (RIE) process.

A further aspect of the present invention provides a method of using a phase shifting mask for use in lithographic processing of semiconductor substrates comprising first providing a mask comprising a quartz mask substrate having a patterned phase shifting layer disposed thereon and having openings therein exposing the quartz mask substrate. The patterned phase shifting layer is comprised of a material of differing composition than the quartz mask substrate and of thickness sufficient to shift the phase of an energy beam passing through the thickness of the patterned layer and the quartz mask substrate by 180 degrees, compared to the phase of the energy beam passing through the phase shifting layer openings and the quartz mask substrate. There is also provided a patterned layer of a material substantially opaque to the energy beam disposed on the quartz mask substrate or the patterned phase shifting mask layer. The method then includes passing an energy beam through the quartz mask substrate and the patterned phase shifting layer and shifting the phase of the energy beam passing through the patterned phase shifting layer by 180° compared to the phase of the energy beam passing through only the quartz mask substrate.

In this method the mask substrate preferably comprises quartz and the patterned phase shifting layer material preferably comprises a silicon oxy nitride, with the latter more preferably comprising $SiO_{0-0.3}N_{0.7-1.4}$.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1:
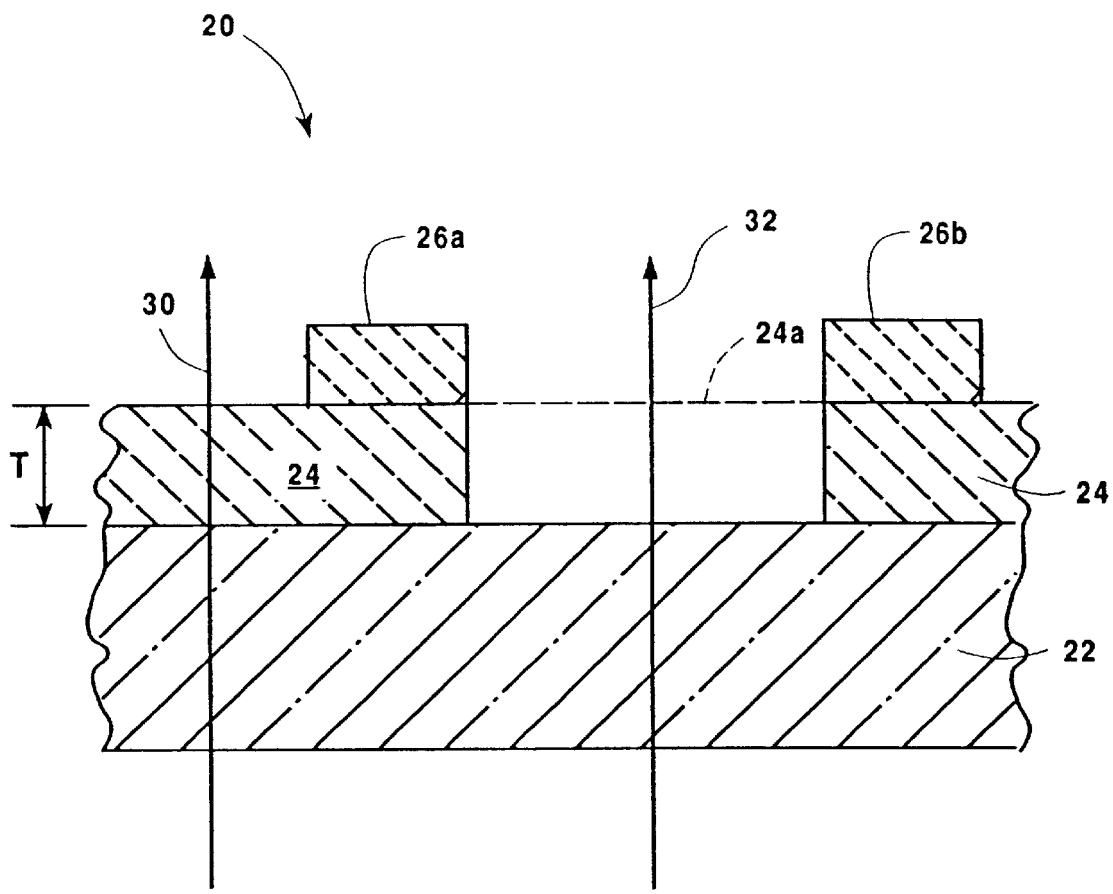
FIG. 1 is a cross-sectional elevational view of a phase shifting mask made in accordance with the present invention.
Figure 2A:
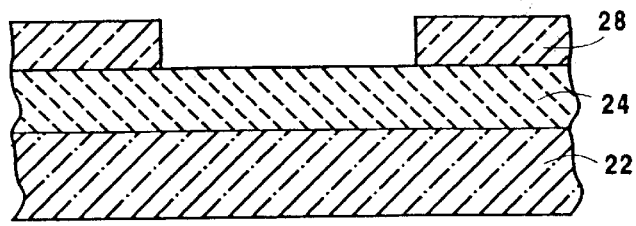
FIG. 2 is a series of cross-sectional elevations (a)–(e) showing the sequence of one method of forming chrome layers on the mask of FIG. 1.
Figure 2B:
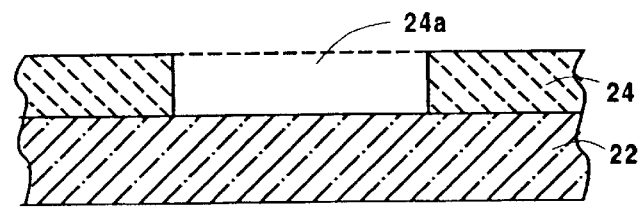
Figure 2C:
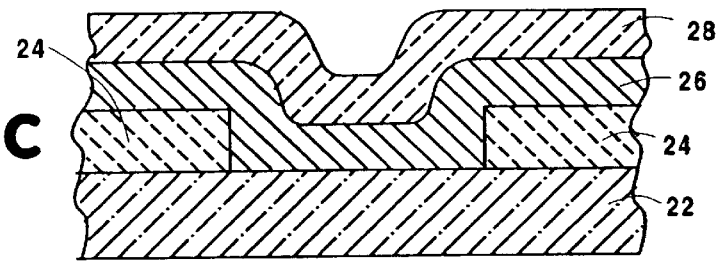
Figure 2D:
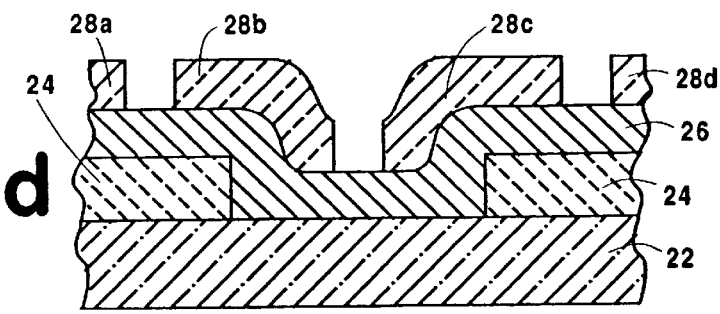
Figure 2E:
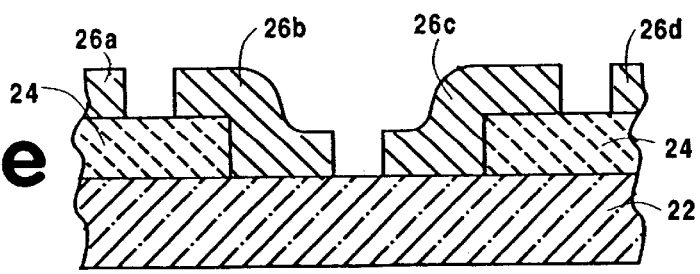
Figure 3A:
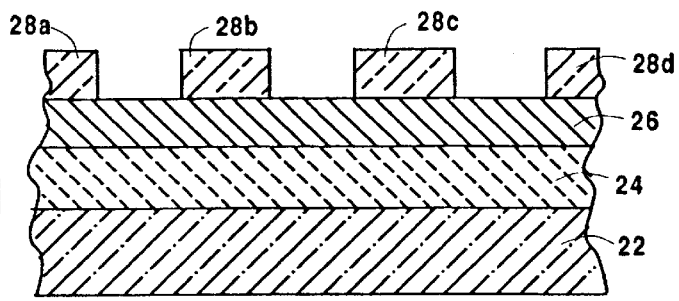
FIG. 3 is a series of cross-sectional elevations (a)–(e) showing the sequence of another method of forming chrome layers on the mask of FIG. 1.
Figure 3B:
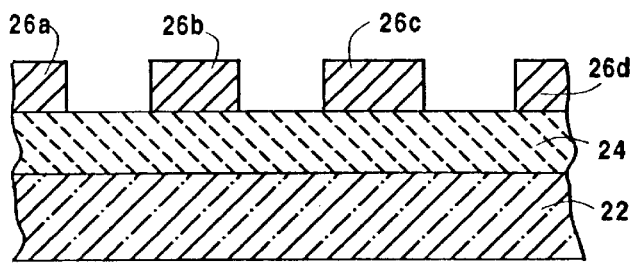
Figure 3C:
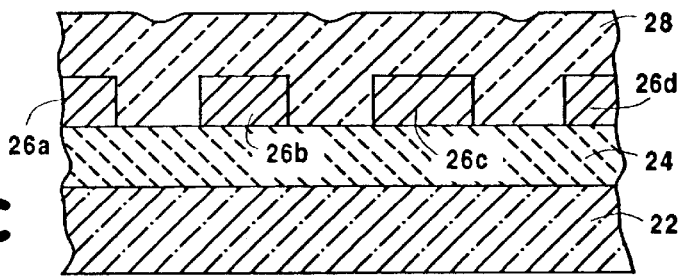
Figure 3D:
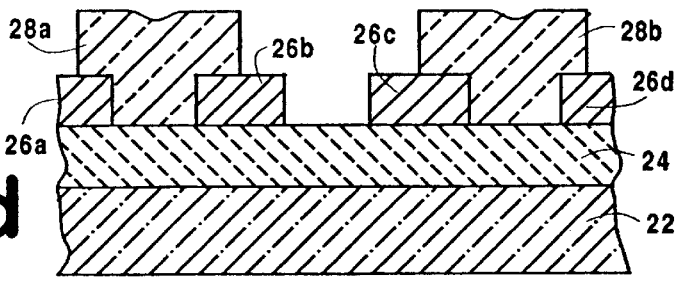
Figure 3E:
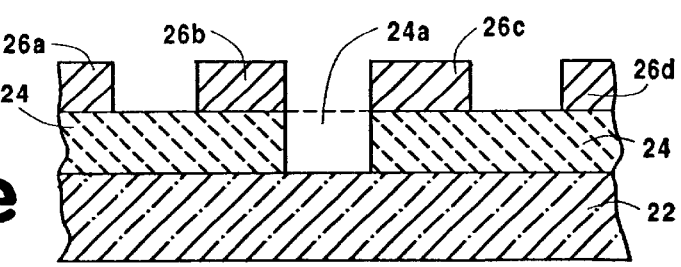

In describing the preferred embodiment of the present invention, reference will be made herein to FIGS. 1–3 of the drawings in which like numerals refer to like features of the invention. Features of the invention are not necessarily shown to scale in the drawings.

To overcome the problems of the prior art, the present invention discloses a phase shifting material and mask structure wherein the phase shifting material is substantially different from the substrate material, yet provides a 180° phase shift compared to the mask substrate, and is also substantially transparent to the energy beam which is transmitted through the mask.

A preferred embodiment of the invention is depicted in FIG. 1 in which a substrate 22 is provided for a mask 20. This substrate is preferably any conventional quartz material utilized in mask substrates. However, instead of etching the quartz substrate to different thicknesses which provide a phase shift, the present invention instead utilizes a layer of a phase shifting material of different composition than the quartz mask substrate over and directly on the surface of the quartz substrate. A pattern 26a, 26b in a chrome layer opaque to the energy beam is formed above the phase shifting material.

The layer of different phase shifting material 24 is initially deposited uniformly and completely over the entire desired area of the quartz mask substrate 22. The differing phase shifting material 24 is of a thickness T sufficient to provide a 180° shift in the phase of an energy beam passing through both the phase shifting layer and the quartz mask substrate, compared to the phase of the energy beam passing through only the quartz substrate 22, after patterning. The phase shifting layer 24 is substantially transparent to the energy being employed. By substantially transparent, it is preferred that the patterned phase shifting layer material has a transmissivity of at least 98% of the energy beam passing therethrough, preferably from about 98% to about 99.5% of the energy beam.

The preferred phase shifting layer material comprises a silicon oxy nitride, i.e. $SiO_xN_y$, more preferably $SiO_{0.0-0.3}N_{0.7-1.4}$. For typical silicon oxy nitride employed with an ultraviolet KrF eximer laser of a wavelength of 248 nm, or with an ArF eximer laser of a wavelength of 193 nm, the thickness T of the phase shifting material should be about 100–200 nm.

The deposited and patterned phase shifting material 24 is essentially transparent to the energy beam while providing a 180° phase shift to the beam. For example, energy beam 32 passes through only the quartz mask substrate 22, while energy beam 30 passes through both the thickness of the quartz mask substrate 22 and the silicon oxy nitride phase shifting layer 24. The phase of energy beam 30 is 180° shifted compared to the phase of energy beam 32 after passing through the mask 20. The net transmission and phase shift of the silicon oxy nitride is a function of the thickness and refractive index of the phase shifting material, and includes contributions from thin film interference effects.

In one method of manufacturing the mask of the present invention, shown in the sequence of steps in FIG. 2, the phase shifting material 24 is initially deposited uniformly over the desired areas of the substrate 22 to the desired final thickness T. By using conventional lithographic methods, a resist layer 28 is patterned to expose selected areas of the phase shifting material 24 to be removed, as shown in FIG. 2(a). By using the resist pattern, the selected area 24a of layer 24 is removed by etching completely down to the surface of quartz mask substrate 22 as shown in FIG. 2(b). The preferred method to remove the selected area 24a of the silicon oxy nitride layer 24 is a $CF_4+O_2$ or $CH_3F+O_2$ reactive ion etch (RIE) process. Because the etched phase shifting material 24 is of a different composition from the quartz mask substrate 22, etch endpoint detection may be employed. In one method of such endpoint detection, the etching of region 24a of layer 24 is continued until a change in the composition and/or concentration of etchant effluent is detected. This endpoint signifies that the etchant has reached, and may be starting to remove, the surface of the quartz mask substrate 22. Alternatively, reflectivity of the film may be monitored during etch, with the endpoint being determined when the reflectivity stops changing as the film is etched. Upon such endpoint detection, the etch process is discontinued. Subsequently, as shown in FIG. 2(c), chrome layer 26, or other material opaque to the energy beam, is deposited, and resist layer 28 is formed thereover. In FIG. 2(d), the resist layer is etched into desired pattern segments 28a, 28b, 28c and 28d, and then in FIG. 2(e) the chrome layers are etched and the resist layer removed, to form the desired chrome pattern segments 26a, 26b, 26c and 26d.

An alternative method of making the mask of the present invention is shown a sequence of steps in FIG. 3. As shown in FIG. 3(a), a uniform coating layer of chrome 26 is deposited over a uniform coating layer of the phase shifting material 24 which is deposited on the quartz substrate 22. The chrome layer is patterned by depositing a resist layer and patterning it into segments 28a, 28b, 28c, 28d, and then etching the chrome by conventional lithographic techniques to form patterned chrome segments 26a, 26b, 26c, 26d (FIG. 3(b)). A resist layer 28 is reapplied (FIG. 3(c)), and a second lithographic exposure is used (FIG. 3(d)) to define the area where the phase shifting material is to be etched. The resist openings are defined to uncover the phase shifting material 24a that is to be etched away, plus a surrounding area of chrome. As shown in FIG. 3(e), the phase shifting material region 24a is etched with an etchant that is selective to (i.e., will not etch) quartz, chrome and resist. In this way, the chrome acts as a hard mask for the phase-shifting material etch, and the phase shifting material is self-aligned to the edge of the chrome patterns.

Repair of the mask made in accordance with the present invention can be more easily implemented by exploiting the difference between the quartz substrate and the phase shifting material. For example, unwanted phase shifting material could be removed by gas-assisted laser or focused ion beam (FIB) repair. The use of silicon oxy nitride phase shifting material of the present invention provides particular advantages in repair as compared to the use of quartz phase shifting materials, since in the latter a laser may not be able to differentiate between a quartz phase shifting material and a quartz substrate. In the present invention, the chemical difference between the phase shifting material and the substrate now enables such repairs to be made without damage to the substrate.

Thus, the present invention provides an improved alternating phase shifting mask for use in lithographic processing of semiconductor substrates, as well as an improved method for making an alternating phase shifting mask in which there is improved control in manufacturing the alternating phase shifting regions and improved ease in repairing any defects in the phase shifting material.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A phase shifting mask for use in lithographic processing of semiconductor substrates comprising:

a mask substrate substantially transparent to the energy beam used in the lithographic processing;

a patterned phase shifting layer disposed on the mask substrate and having openings therein exposing the mask substrate, the patterned phase shifting layer being comprised of a material of differing composition than the mask substrate and of thickness sufficient to shift the phase of an energy beam passing through the thickness of the patterned layer and the mask substrate by 180 degrees, compared to the phase of the energy beam passing through the phase shifting layer openings and the mask substrate; and a patterned layer of a material substantially opaque to the energy beam having a portion disposed on the mask substrate, through the openings in the phase shifting layer, and having a portion disposed on the patterned phase shifting mask layer.

2. The mask of claim 1 wherein the patterned phase shifting layer material is substantially transparent to the energy beam, and wherein the layer of a material substantially opaque to the energy beam has an opening in the portion disposed on the mask substrate and an opening in the portion disposed on the phase shifting mask layer.

3. The mask of claim 1 wherein the patterned phase shifting layer material has a transmissivity of at least about 98% of the energy beam passing therethrough.

4. The mask of claim 1 wherein the patterned phase shifting layer material has a transmissivity of about 98% to about 99.5% of the energy beam passing therethrough.

5. The mask of claim 1 wherein the mask substrate comprises quartz.

6. The mask of claim 5 wherein the patterned phase shifting layer material comprises a silicon oxy nitride.

7. The mask of claim 6 wherein the patterned phase shifting layer thickness is about 100–200 nm.

8. A phase shifting mask for use in lithographic processing of semiconductor substrates comprising:

a quartz mask substrate;

a patterned phase shifting layer disposed on the quartz mask substrate and having openings therein exposing the quartz mask substrate, the patterned phase shifting layer being comprised of a silicon oxy nitride of thickness sufficient to shift the phase of an energy beam passing through the thickness of the patterned layer and the quartz mask substrate by 180 degrees, compared to the phase of the energy beam passing through the phase shifting layer openings and the quartz mask substrate, the silicon oxy nitride having a transmissivity of at least about 98% of the energy beam passing therethrough; and a patterned layer of a material substantially opaque to the energy beam having a portion disposed on the quartz mask substrate, through the openings in the phase shifting layer, and having a portion disposed on the patterned phase shifting mask layer.

9. The mask of claim 8 wherein the patterned phase shifting layer thickness is about 100–200 nm, and wherein the layer of a material substantially opaque to the energy beam has an opening in the portion disposed on the mask substrate and an opening in the portion disposed on the phase shifting mask layer.

10. A method of making a phase shifting mask for use in lithographic processing of semiconductor substrates comprising:

providing a mask substrate;

depositing on the mask substrate a patterned phase shifting layer, the patterned phase shifting layer having openings therein exposing the mask substrate, the patterned phase shifting layer being comprised of a material of differing composition than the mask substrate and of thickness sufficient to shift the phase of an energy beam passing through the thickness of the patterned layer and the mask substrate by 180 degrees, compared to the phase of the energy beam passing through the phase shifting layer openings and the mask substrate; and depositing on the mask substrate a patterned layer of a material substantially opaque to the energy beam having a portion disposed on and in contact with the mask substrate and having a portion disposed on and in contact with the patterned phase shifting mask layer.

11. The method of claim 10 wherein the patterned phase shifting layer material is substantially transparent to the energy beam, and wherein the layer of a material substantially opaque to the energy beam has an opening in the portion disposed on the mask substrate and an opening in the portion disposed on the phase shifting mask layer.

12. The method of claim 10 wherein the patterned phase shifting layer material has a transmissivity of at least about 98% of the energy beam passing therethrough.

13. The method of claim 10 wherein the mask substrate comprises quartz.

14. The method of claim 13 wherein the patterned phase shifting layer material comprises a silicon oxy nitride.

15. The method of claim 14 wherein the patterned phase shifting layer is deposited on the quartz mask substrate at a thickness of about 100–200 nm.

16. The method of claim 10 wherein the patterned phase shifting layer is deposited on the quartz mask substrate by depositing a uniform layer of the phase shifting material and etching selected areas of the uniform layer to form the patterned phase shifting layer, and wherein during the etching the quartz mask substrate acts as an etch stop.

17. The method of claim 16 wherein the etching is performed with a $CF_4+O_2$ or $CH_3F+O_2$ RIE process.

18. A method of using a phase shifting mask for use in lithographic processing of semiconductor substrates comprising:

providing a mask comprising a quartz mask substrate having a patterned phase shifting layer disposed thereon and having openings therein exposing the quartz mask substrate, the patterned phase shifting layer being comprised of a material of differing composition than the quartz mask substrate and of thickness sufficient to shift the phase of an energy beam passing through the thickness of the patterned layer and the quartz mask substrate by 180 degrees, compared to the phase of the energy beam passing through the phase shifting layer openings and the quartz mask substrate, and a patterned layer of a material substantially opaque to the energy beam having a portion disposed on the quartz mask substrate, through the openings in the phase shifting layer, and having a portion disposed on the patterned phase shifting mask layer;

passing an energy beam through the quartz mask substrate and the patterned phase shifting layer; and shifting the phase of the energy beam passing through the patterned phase shifting layer by 180° compared to the phase of the energy beam passing through only the quartz mask substrate.

19. The method of claim 18 wherein the mask substrate quartz and the patterned phase shifting layer material comprises a silicon oxy nitride, and wherein the layer of a material substantially opaque to the energy beam has an opening in the portion disposed on the mask substrate and an opening in the portion disposed on the phase shifting mask layer.

20. The method of claim 19 wherein the patterned silicon oxy nitride phase shifting layer material comprises $SiO_{0-0.3}N_{0.7-1.4}$.

* * * * *